United States Patent
Elliott et al.

(10) Patent No.: US 7,791,679 B2
(45) Date of Patent: Sep. 7, 2010

(54) ALTERNATIVE THIN FILM TRANSISTORS FOR LIQUID CRYSTAL DISPLAYS

(75) Inventors: Candice Hellen Brown Elliott, Vallejo, CA (US); Thomas Lloyd Credelle, Morgan Hill, CA (US); Matthew Osborne Schlegel, Palo Alto, CA (US)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 68 days.

(21) Appl. No.: 10/456,794

(22) Filed: Jun. 6, 2003

(65) Prior Publication Data

US 2004/0246393 A1 Dec. 9, 2004

(51) Int. Cl.
G02F 1/036 (2006.01)
G02F 1/1343 (2006.01)

(52) U.S. Cl. .................................. 349/42; 349/139

(58) Field of Classification Search ............. 349/38–43, 349/139; 257/72, 59
See application file for complete search history.

(56) References Cited

U.S. PATENT DOCUMENTS

| | | | |
|---|---|---|---|
| 3,971,065 A | 7/1976 | Bayer | |
| 4,632,514 A | 12/1986 | Ogawa et al. | |
| 4,642,619 A | 2/1987 | Togashi | |
| 4,651,148 A | 3/1987 | Takeda et al. | |
| 4,773,737 A | 9/1988 | Yokono et al. | |
| 4,781,438 A | 11/1988 | Noguchi | |
| 4,800,375 A | 1/1989 | Silverstein et al. | |
| 4,822,142 A * | 4/1989 | Yasui ........................ | 349/48 |
| 4,908,609 A | 3/1990 | Stroomer | |
| 4,920,409 A | 4/1990 | Yamagishi | |
| 4,965,565 A | 10/1990 | Noguchi | |
| 5,006,840 A | 4/1991 | Hamada et al. | |
| 5,052,785 A | 10/1991 | Takimoto et al. | |
| 5,097,297 A | 3/1992 | Nakazawa | |
| 5,113,274 A | 5/1992 | Takahashi et al. | |
| 5,124,695 A | 6/1992 | Green | |
| 5,144,288 A | 9/1992 | Hamda et al. | |
| 5,184,114 A | 2/1993 | Brown | |
| 5,191,451 A | 3/1993 | Katayama et al. | |
| 5,311,205 A | 5/1994 | Hamada et al. | |
| 5,384,266 A | 1/1995 | Chapman | |
| 5,436,747 A | 7/1995 | Suzuki | |
| 5,459,595 A | 10/1995 | Ishiguro | |

(Continued)

FOREIGN PATENT DOCUMENTS

EP 0671 650 9/1995

(Continued)

OTHER PUBLICATIONS

Merriam Webster's Collegiate Dictionary, 10TH Ed., at pp. 674 and 1174 ; Copyright 1999.*

(Continued)

*Primary Examiner*—Dung T. Nguyen
(74) *Attorney, Agent, or Firm*—Innovation Counsel LLP

(57) ABSTRACT

Alternative thin film transistors for liquid crystal displays are disclosed. The alternative transistors can be used for panels of displays such as liquid crystal displays (LCDs), especially those having alternative pixel arrangements. These transistors can be oriented on a panel of an LCD using different, non-traditional configurations, while addressing misalignment and parasitic capacitance.

18 Claims, 8 Drawing Sheets

U.S. PATENT DOCUMENTS

| | | | |
|---|---|---|---|
| 5,485,293 | A | 1/1996 | Robinder |
| 5,535,028 | A | 7/1996 | Bae et al. |
| 5,646,702 | A | 7/1997 | Akinwande et al. |
| 5,739,802 | A | 4/1998 | Mosier |
| 5,767,829 | A | 6/1998 | Verhulst |
| 5,808,594 | A | 9/1998 | Tsubyama et al. |
| 5,877,512 | A | 3/1999 | Kim |
| 5,899,550 | A | 5/1999 | Masaki |
| 5,949,396 | A | 9/1999 | Lee |
| 6,037,719 | A | 3/2000 | Yap et al. |
| 6,064,363 | A | 5/2000 | Kwon |
| 6,144,352 | A | 11/2000 | Matsuda et al. |
| 6,219,019 | B1 | 4/2001 | Hasegawa |
| 6,225,967 | B1 | 5/2001 | Hebiguchi |
| 6,326,981 | B1 | 12/2001 | Mori et al. |
| 6,335,719 | B1 | 1/2002 | An et al. |
| 6,340,998 | B1 | 1/2002 | Kim et al. |
| 6,552,706 | B1 | 4/2003 | Ikeda et al. |
| 6,590,555 | B2 | 7/2003 | Su et al. |
| 6,661,429 | B1 | 12/2003 | Phan |
| 6,680,761 | B1 | 1/2004 | Greene et al. |
| 6,738,204 | B1 | 5/2004 | Chuang et al. |
| 6,771,028 | B1 | 8/2004 | Winters |
| 6,833,888 | B2 | 12/2004 | Song et al. |
| 6,833,890 | B2 | 12/2004 | Hong et al. |
| 6,836,300 | B2 | 12/2004 | Choo et al. |
| 6,850,294 | B2 | 2/2005 | Roh et al. |
| 6,903,754 | B2 | 6/2005 | Brown Elliott |
| 6,950,115 | B2 | 9/2005 | Brown Elliott |
| 7,046,256 | B2 | 5/2006 | Credelle |
| 7,123,277 | B2 | 10/2006 | Brown Elliott et al. |
| 7,187,353 | B2 | 3/2007 | Credelle et al. |
| 7,209,105 | B2 | 4/2007 | Elliott |
| 7,218,301 | B2 | 5/2007 | Credelle |
| 7,283,142 | B2 * | 10/2007 | Credelle et al. ............. 345/694 |
| 2001/0017607 | A1 | 8/2001 | Kwon et al. |
| 2002/0015110 | A1 | 2/2002 | Brown Elliott |
| 2002/0158997 | A1 * | 10/2002 | Fukami et al. ................ 349/49 |
| 2003/0016310 | A1 | 1/2003 | Lee |
| 2003/0034992 | A1 | 2/2003 | Brown Elliott et al. |
| 2003/0063054 | A1 | 4/2003 | Inukai |
| 2003/0071943 | A1 | 4/2003 | Choo et al. |
| 2003/0090581 | A1 | 5/2003 | Credelle et al. |
| 2003/0117423 | A1 | 6/2003 | Brown Elliott |
| 2003/0128225 | A1 | 7/2003 | Credelle et al. |
| 2003/0189537 | A1 | 10/2003 | Yun |
| 2004/0021804 | A1 | 2/2004 | Hong et al. |
| 2004/0046714 | A1 | 3/2004 | Brown Elliott |
| 2004/0051724 | A1 | 3/2004 | Elliott et al. |
| 2004/0085495 | A1 | 5/2004 | Roh et al. |
| 2004/0095521 | A1 | 5/2004 | Song et al. |
| 2004/0140983 | A1 | 7/2004 | Credelle |
| 2004/0223005 | A1 | 11/2004 | Lee |
| 2004/0239837 | A1 | 12/2004 | Hong et al. |
| 2004/0246213 | A1 | 12/2004 | Credelle et al. |
| 2004/0246278 | A1 | 12/2004 | Elliott |
| 2004/0246279 | A1 | 12/2004 | Credelle et al. |
| 2004/0246280 | A1 | 12/2004 | Credelle et al. |
| 2004/0246381 | A1 | 12/2004 | Credelle |
| 2004/0246404 | A1 | 12/2004 | Elliott et al. |
| 2005/0083277 | A1 | 4/2005 | Credelle |
| 2005/0083356 | A1 | 4/2005 | Roh et al. |
| 2005/0162600 | A1 | 7/2005 | Rho et al. |
| 2005/0174363 | A1 | 8/2005 | Brown Elliott |
| 2005/0212741 | A1 | 9/2005 | Schlegel |
| 2005/0219274 | A1 | 10/2005 | Yang et al. |
| 2007/0146270 | A1 | 6/2007 | Credelle et al. |

FOREIGN PATENT DOCUMENTS

| | | |
|---|---|---|
| JP | 08-202317 | 8/1996 |
| WO | WO 03/014819 | 2/2003 |
| WO | WO 2004/027503 A1 | 4/2004 |

OTHER PUBLICATIONS

USPTO, Non-Final Office Action, dated Sep. 2, 2004 in US Patent Publication No. 2004/0246404, (U.S. Appl. No. 10/456,838).

Clairvoyante Inc, Response to Non-Final Office Action, dated Jan. 28, 2005 in US Patent Publication No. 2004/0246404, (U.S. Appl. No. 10/456,838).

USPTO, Final Office Action, dated Jun. 9, 2005 in US Patent Publication No. 2004/0246404, (U.S. Appl. No. 10/456,838).

Clairvoyante Inc, Response to Final Office Action, dated Dec. 5, 2005 in US Patent Publication No. 2004/0246404, (U.S. Appl. No. 10/456,838).

USPTO, Non-Final Office Action, dated Mar. 29, 2006 in US Patent Publication No. 2004/0246404, (U.S. Appl. No. 10/456,838).

Brown Elliott, C., "Active Matrix Display . . . ", IDMC 2000, 185-189, Aug. 2000.

Brown Elliot, C, "Co-Optimization of Color AMLCD Subpixel Architecture and Rendering Algorithms," SID 2002 Proceedings Paper, May 30, 2002 pp. 172-175.

Brown Elliott, C, "New Pixel Layout for Pen Tile Matrix™ Architecture", IDMC 2002, pp. 115-117.

Brown Elliott, C, "Pentile Matrix™ Displays and Drivers" ADEAC Proceedings Paper, Portland OR., Oct. 2005.

Brown Elliott, C, "Reducing Pixel Count Without Reducing Image Quality", Information Display Dec. 1999, vol. 1, pp. 22-25.

PCT International Search Report dated Aug. 21, 2002 for PCT/US02/14925 (U.S. Appl. No. 10/024,326).

PCT International Search Report dated Jan. 10, 2006 for PCT/US04/18035 (U.S. Appl. No. 10/456,806).

PCT International Search Report dated Sep. 24, 2004 for PCT/US04/17796 (U.S. Appl. No. 10/456,838).

PCT International Search Report dated Feb. 24, 2005 for PCT/US04/18037 (U.S. Appl. No. 10/456,838).

USPTO, Non-Final Office Action, dated Jan. 15, 2004 in US Patent No. 6,950,115 (U.S. Appl. No. 10/024,326).

Clairvoyante Inc., Response to Non-Final Office Action, dated May 10, 2004 in US Patent No. 6,950,115 (U.S. Appl. No. 10/024,326).

USPTO, Non-Final Office Action, dated Jun. 28, 2004 in US Patent No. 6,950,115 (U.S. Appl. No. 10/024,326).

Clairvoyante Inc., Response to Non-Final Office Action, dated Oct. 27, 2004 in US Patent No. 6,950,115 (U.S. Appl. No. 10/024,326).

USPTO, Notice of Allowance, dated Jun. 1, 2005 in US Patent No. 6,950,115 (U.S. Appl. No. 10/024,326).

USPTO, Non-Final Office Action dated Oct. 19, 2005 in US Patent No. 7,187,353 (U.S. Appl. No. 10/456,806).

Clairvoyante Inc, Response to Non-Final Office Action dated Feb. 21, 2005 in US Patent No. 7,187,353 (U.S. Appl. No. 10/456,806).

USPTO, Final Office Action dated May 2, 2006 in US Patent No. 7,187,353 (U.S. Appl. No. 10/456,806).

Clairvoyante Inc, Response to Final Office Action dated Aug. 2, 2006 in US Patent No. 7,187,353 (U.S. Appl. No. 10/456,806).

USPTO, Notice of Allowance, dated Sep. 18, 2006 in US Patent No. 7,187,353 (U.S. Appl. No. 10/456,806).

Clairvoyante Inc, Response to Non-Final Office Action dated Sep. 14, 2006 in US Patent Publication No. 2004/0246404 (U.S. Appl. No. 10/456,838).

USPTO, Final Office Action dated Jan. 18, 2007 in US Patent Publication No. 2004/0246404 (U.S. Appl. No. 10/456,838).

Clairvoyante Inc, Response to Final Office Action dated Jun. 18, 2007 in US Patent Publication No. 2004/0246404 (U.S. Appl. No. 10/456,838).

USPTO, Non-Final Office Action dated Jul. 27, 2007 in US Patent Publication No. 2004/0246404 (U.S. Appl. No. 10/456,838).

* cited by examiner

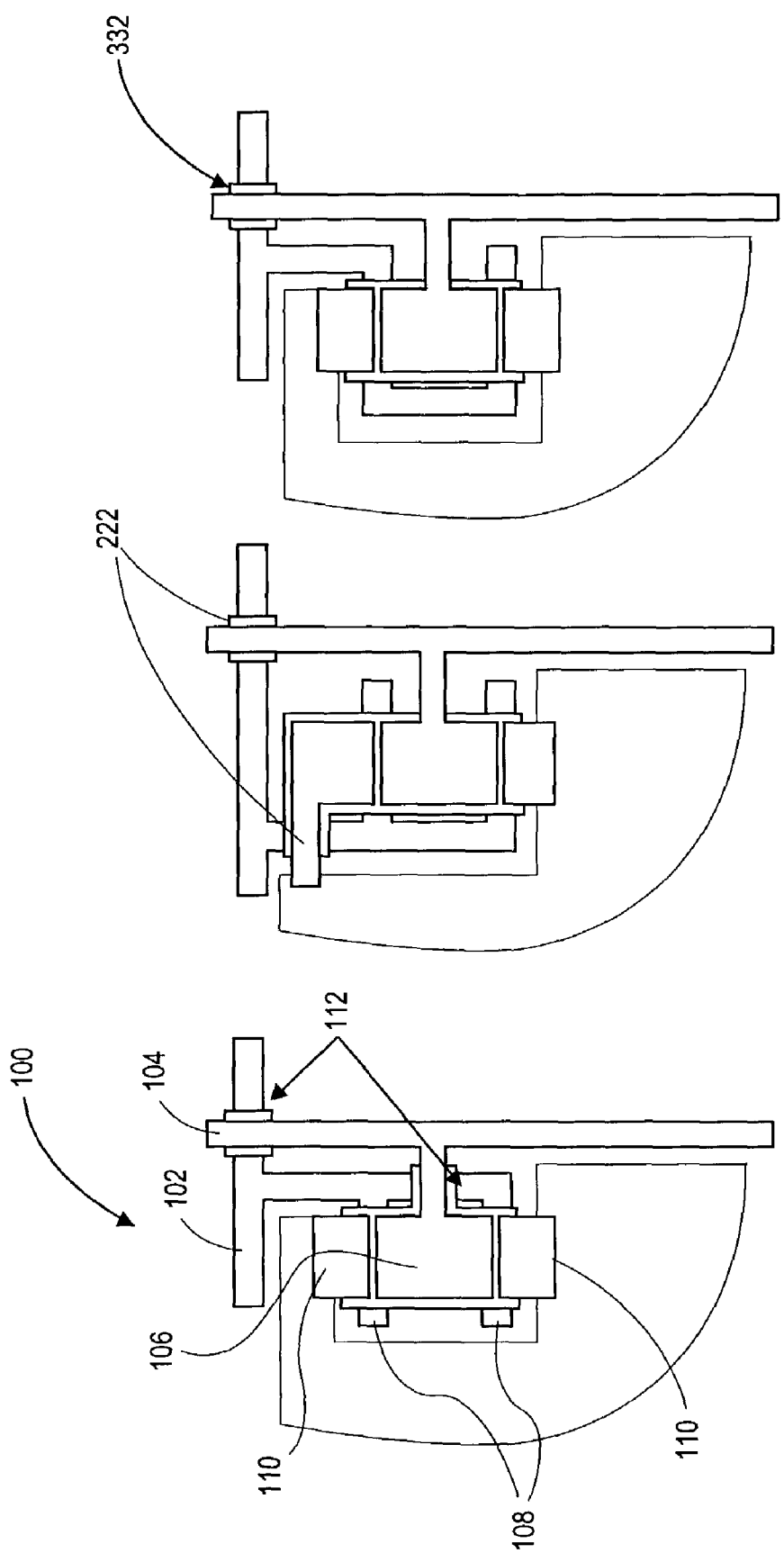

US 7,791,679 B2

ALTERNATIVE THIN FILM TRANSISTORS FOR LIQUID CRYSTAL DISPLAYS

BACKGROUND

Thin-film transistor (TFT) misalignment and parasitic capacitance can degrade the quality and performance of electronic devices such as liquid crystal displays (LCDs). One known attempt to correct for TFT misalignments and any associated increase in parasitic capacitance is found in U.S. Pat. No. 5,191,451 to Katayama et al ("the '451 patent"). FIG. 1 depicts the "double TFT" arrangement 100 of the '451 patent. Source line 104 connects to the TFT via source electrode 106. Two gate electrodes 108 are connected to gate line 102. Two drain electrodes 110 connect to the pixel and are formed such that the two gate electrodes 108 affect conduction from the source electrode to the drain electrodes when activated. It is noted that there are two crossover regions 112 that are connected to TFT may produce additional parasitic capacitance between the gate and the source. As discussed in the '451 patent, any vertical misalignment of the TFT placement is somewhat corrected by this double TFT arrangement as is discussed therein.

Another manner of reducing the ill effects of TFT misalignment is shown in U.S. Pat. No. 5,097,297 to Nakazawa ("the '297 patent"). FIG. 4 depicts a TFT 400 made in the manner taught in the '297 patent. As may be seen in FIG. 2, gate line 402 delivers the gate signal to gate electrode 408. Source line 404 sends image data to source electrodes 406. When the gate electrode is activated, the image data is transferred to the pixel via the drain electrode 410. It is noted that this TFT embodiment contains only one gate crossover 412 which aids in reducing parasitic capacitance.

Furthermore, prior LCDs use the same orientation to align transistor in the pixel area of the display. However, for alternative pixel arrangements, transistors may need to be located in unconventional locations of a pixel area, while addressing misalignment and parasitic capacitance.

BRIEF DESCRIPTION OF THE DRAWINGS

The accompanying drawings, which are incorporated in, and constitute a part of this specification illustrate exemplary implementations and embodiments of the invention and, together with the description, serve to explain principles of the invention.

FIG. 1 shows a prior art TFT having a double source/drain structure.

FIGS. 2 and 3 show alternative TFTs having a double source/drain structure.

DETAILED DESCRIPTION

Reference will now be made in detail to implementations and embodiments, examples of which are illustrated in the accompanying drawings. Wherever possible, the same reference numbers will be used throughout the drawings to refer to the same or like parts.

The following implementations and embodiments disclose alternative thin film transistors for liquid crystal displays are disclosed. The alternative transistors can be used for panels of displays such as liquid crystal displays (LCDs), especially those having alternative pixel arrangements. These transistors can be oriented on a panel of an LCD using different, non-traditional configurations, while addressing misalignment and parasitic capacitance.

FIGS. 2 and 3 provide different alternative embodiments to the prior art double TFT structure shown in FIG. 1. These structures can provide reduced source to gate capacitance, which can cause crosstalk in certain images. However, the gate to drain crossover can lessen the damage to image quality. One advantage of the embodiment of FIG. 3 is that there is only one crossover 132 that may reduce parasitic capacitance.

Another set of TFT redesigns are shown in FIGS. 5 through 10 to handle the unevenness of parasitic capacitance that might be introduced by the above described TFT remapping. As TFTs are remapped on the panel, it is possible for some TFTs on the panel to be implemented in different corners or quadrants of a pixel area. For example, some TFTs may be constructed in the upper left hand corner of the pixel area, some in the upper right hand corner of the pixel area and so on. If all such TFTs were constructed the same way, then it would be likely that the source-drain orientation would be reversed for left hand corner and right hand corner implementation. Such non-uniformity of construction might introduce uneven parasitic capacitance in the case of a given TFT misalignment.

Figure 4:
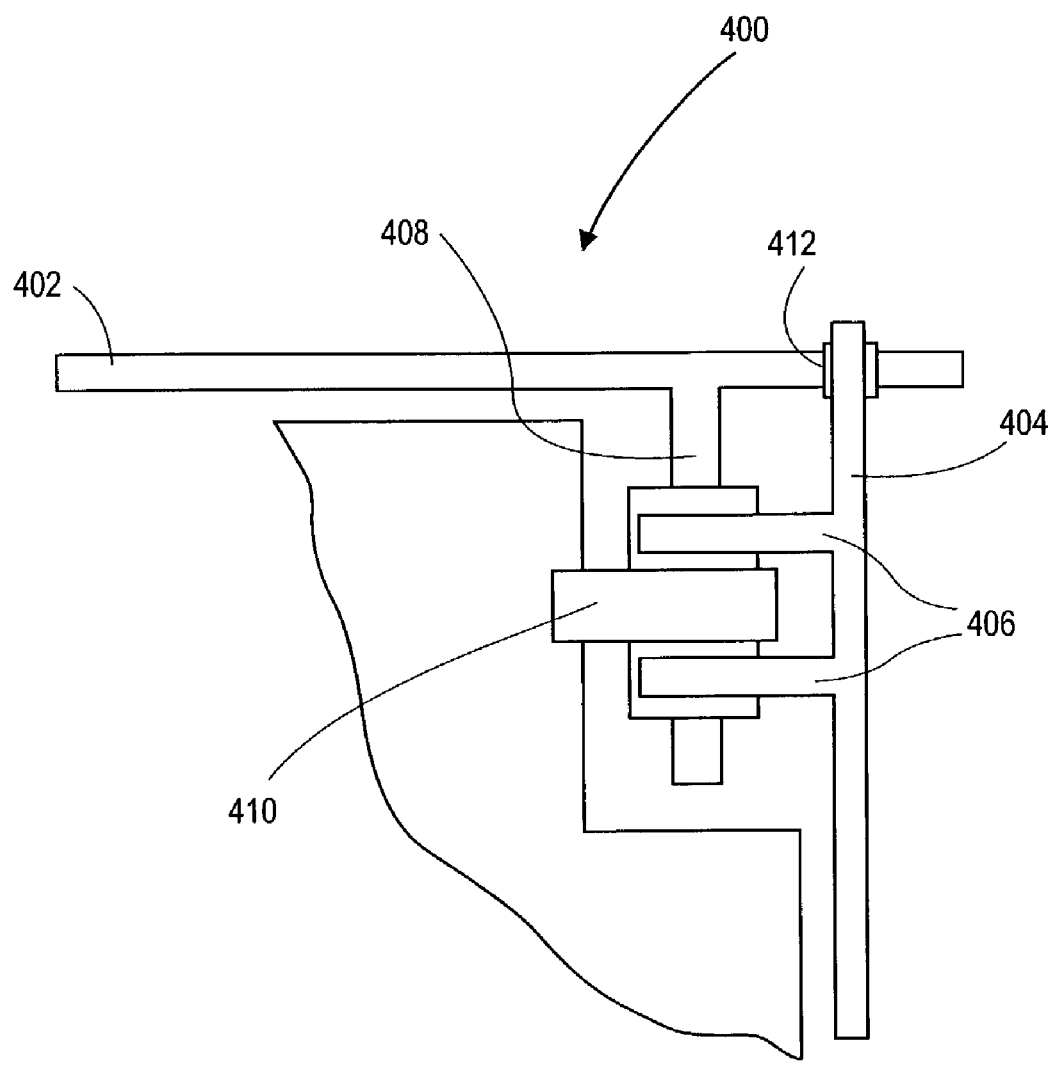
FIG. 4 shows a prior art TFT with a double gate structure.
Figure 5:
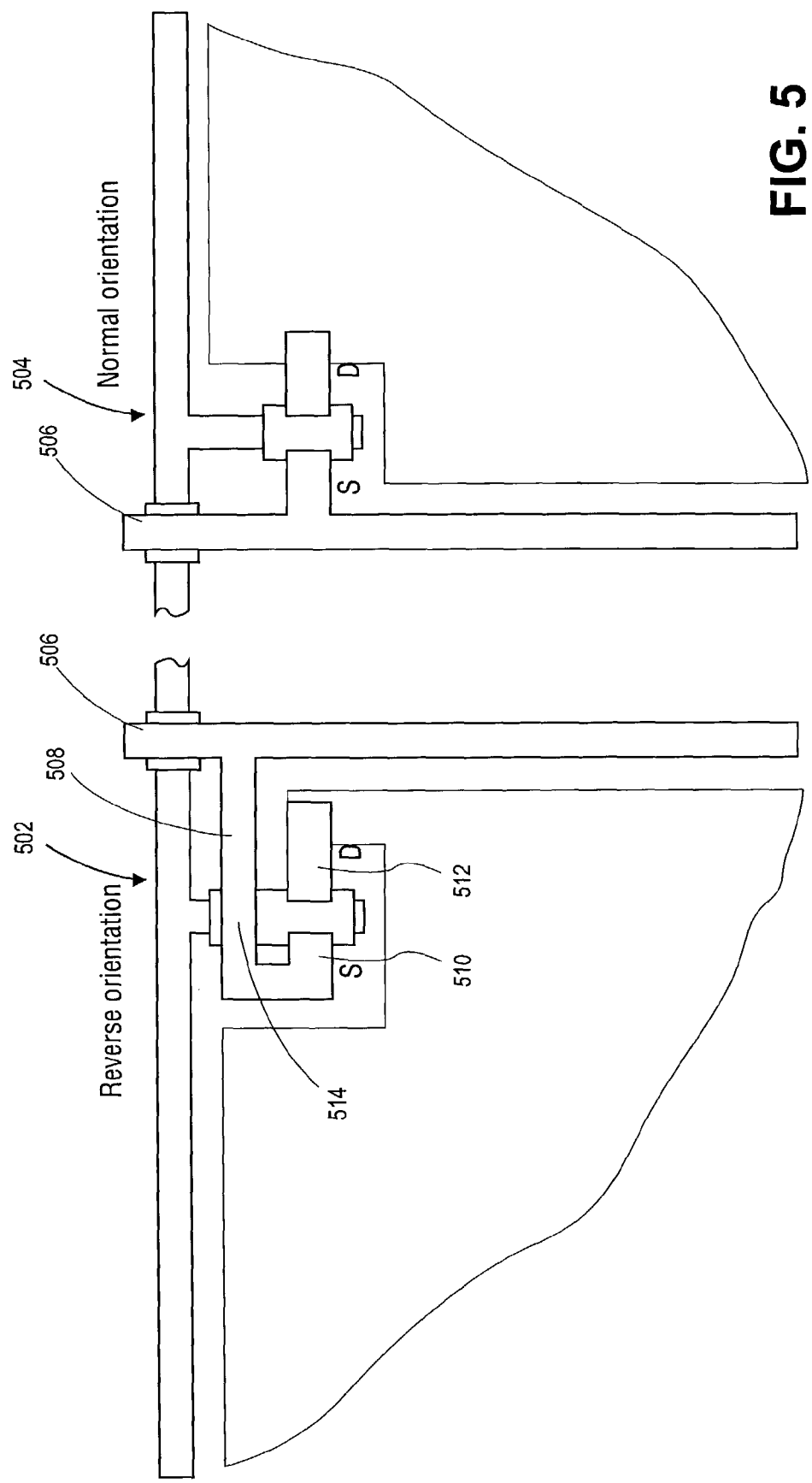
FIG. 5 show TFT structures in a reverse orientation and normal orientation, respectively.

FIG. 5 is one embodiment of a TFT built with a reverse orientation 502 as compared with a TFT built with a typical orientation 1904. For exemplary purposes, TFT 504 is constructed within the upper left hand corner of its associated pixel in the usual manner—i.e. without any crossovers to avoid any introduced parasitic capacitance. It is noted that the source (S) and drain (D) electrodes are placed in a left-to-right fashion. TFT 502 is shown constructed in the upper right hand corner of a pixel area in a reverse orientation—i.e. a crossover 514 from source line 1906 is constructed so that the source electrode 1910 and drain electrode 512 are also in left-to-right fashion. Thus, if there is a TFT misalignment in the horizontal direction, then TFTs 502 and 504 will receive the same amount of added parasitic capacitance—thus, keeping the panel's defects uniform. It will be appreciated that although TFT 502 and TFT 504 are depicted side-by-side and connected to the same column, this is primarily for explanatory purposes. It is unlikely that two adjoining subpixels would share the same column/data line—thus, TFT 504 and its associated pixel is provided to show the distinction between a normal TFT orientation and TFT 502 in a reverse orientation.

Figure 6:
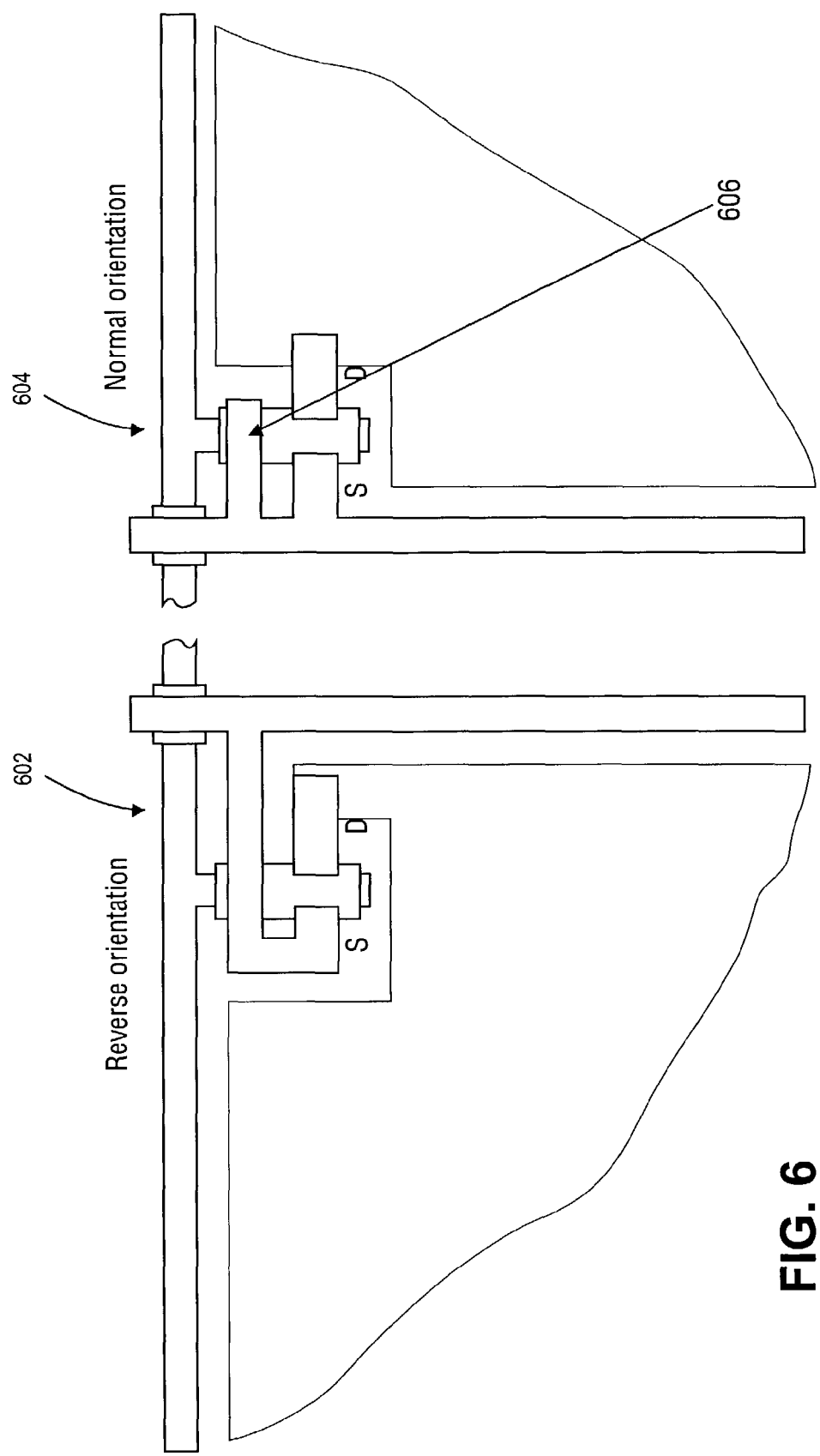
FIG. 6 show TFT structures in a reverse orientation and normal orientation with an added gate crossover in the normal orientation to balance any parasitic capacitance found in the reverse orientation.
Figure 7:
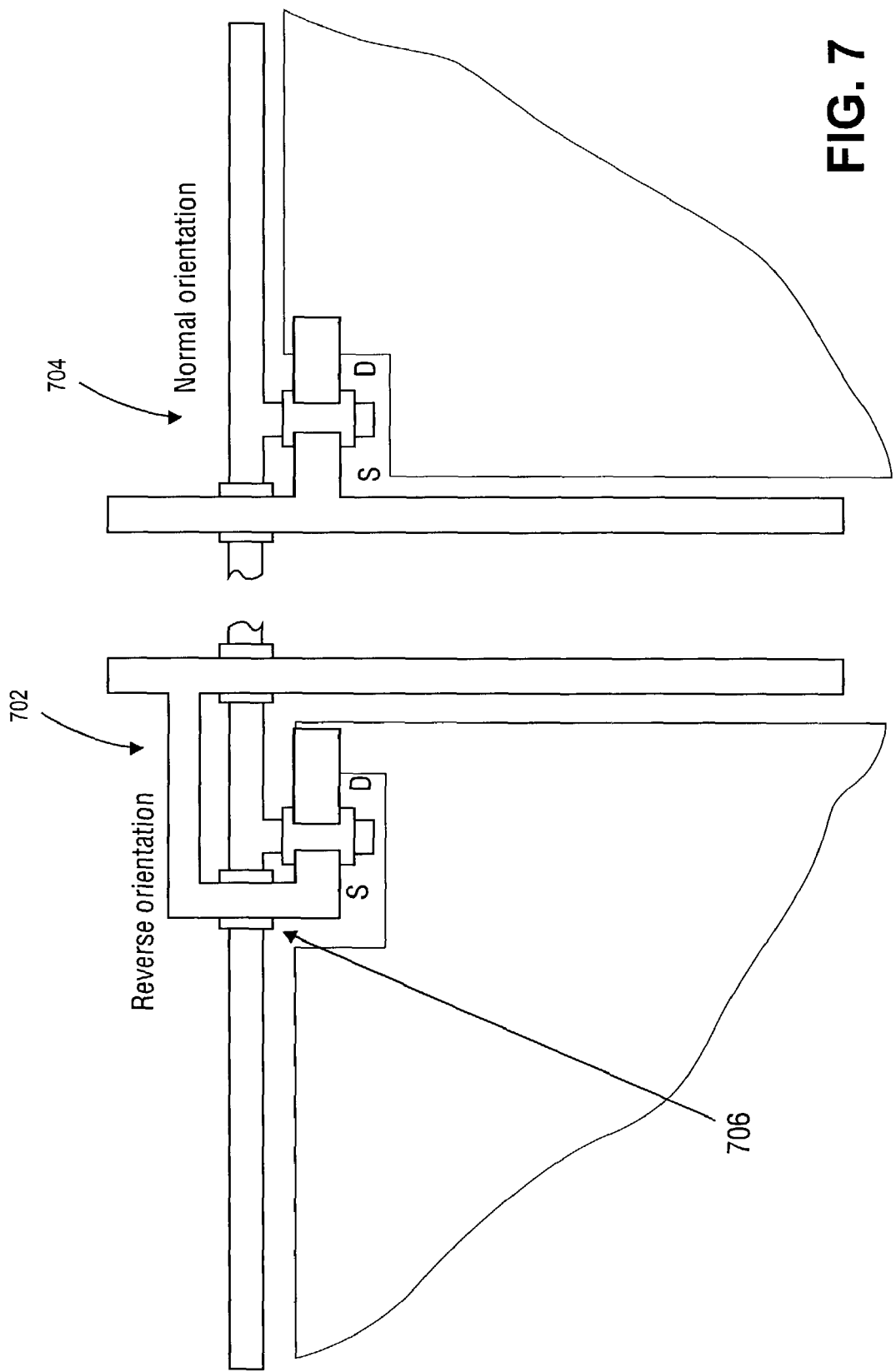
FIG. 7 show TFT structures in a reverse orientation and normal orientation with one fewer gate crossover in the reverse orientation to match any parasitic capacitance in the normal orientation.

FIG. 6 shows another embodiment of TFTs 602 and 604. As can be seen, a new crossover 606 is added to TFT 604 so as to balance the added parasitic capacitance via crossover 604. FIG. 7 is yet another embodiment of TFTs 702 and 704. As may be seen here, the gate electrode crossover 606 in FIG.

6 has been removed in favor of a gate line crossover 706 which may have a lesser impact on individual pixel elements.

Figure 8:
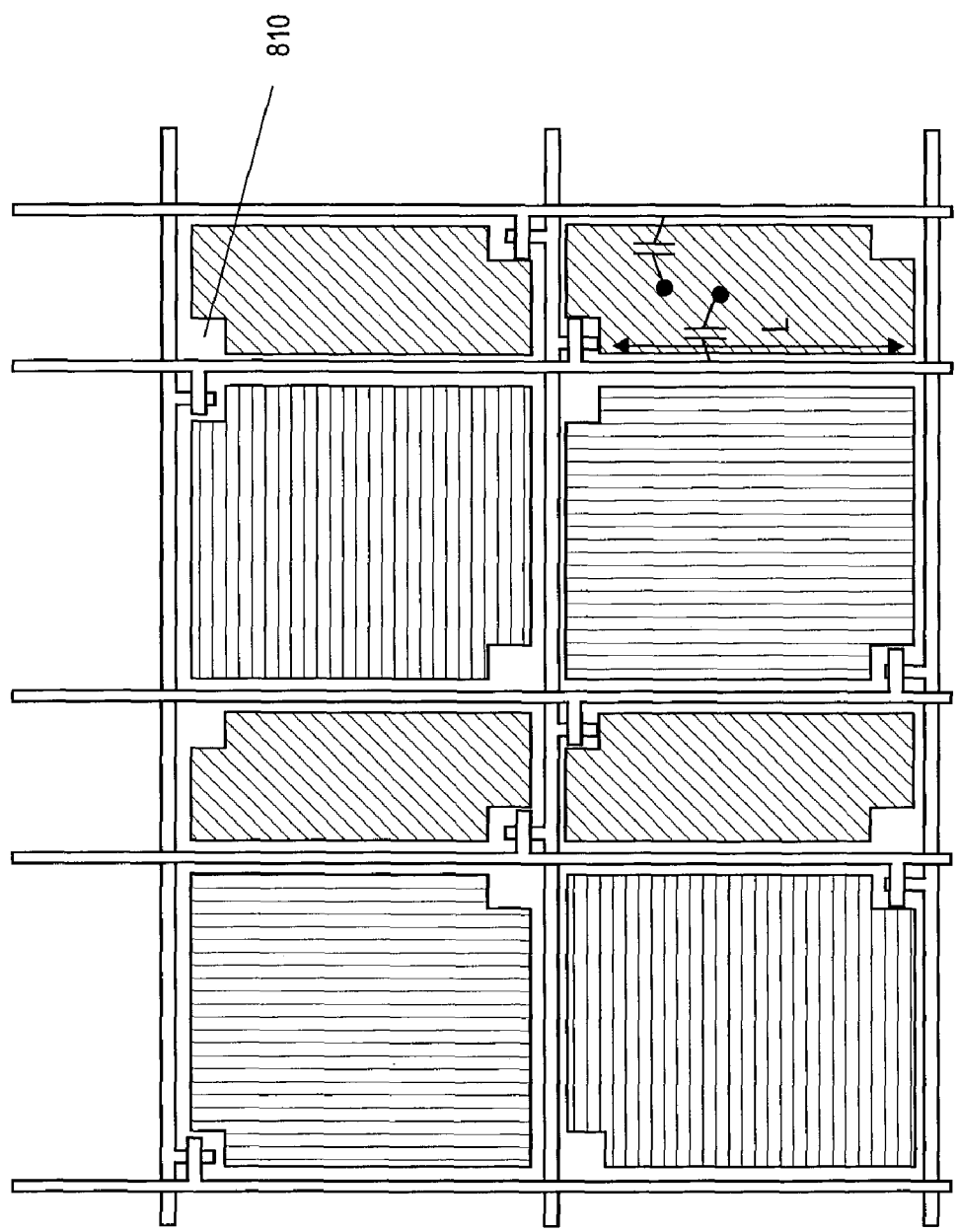
FIG. 8 shows one novel pixel element design having a corner removed from the pixel to balance parasitic capacitances.
Figure 9:
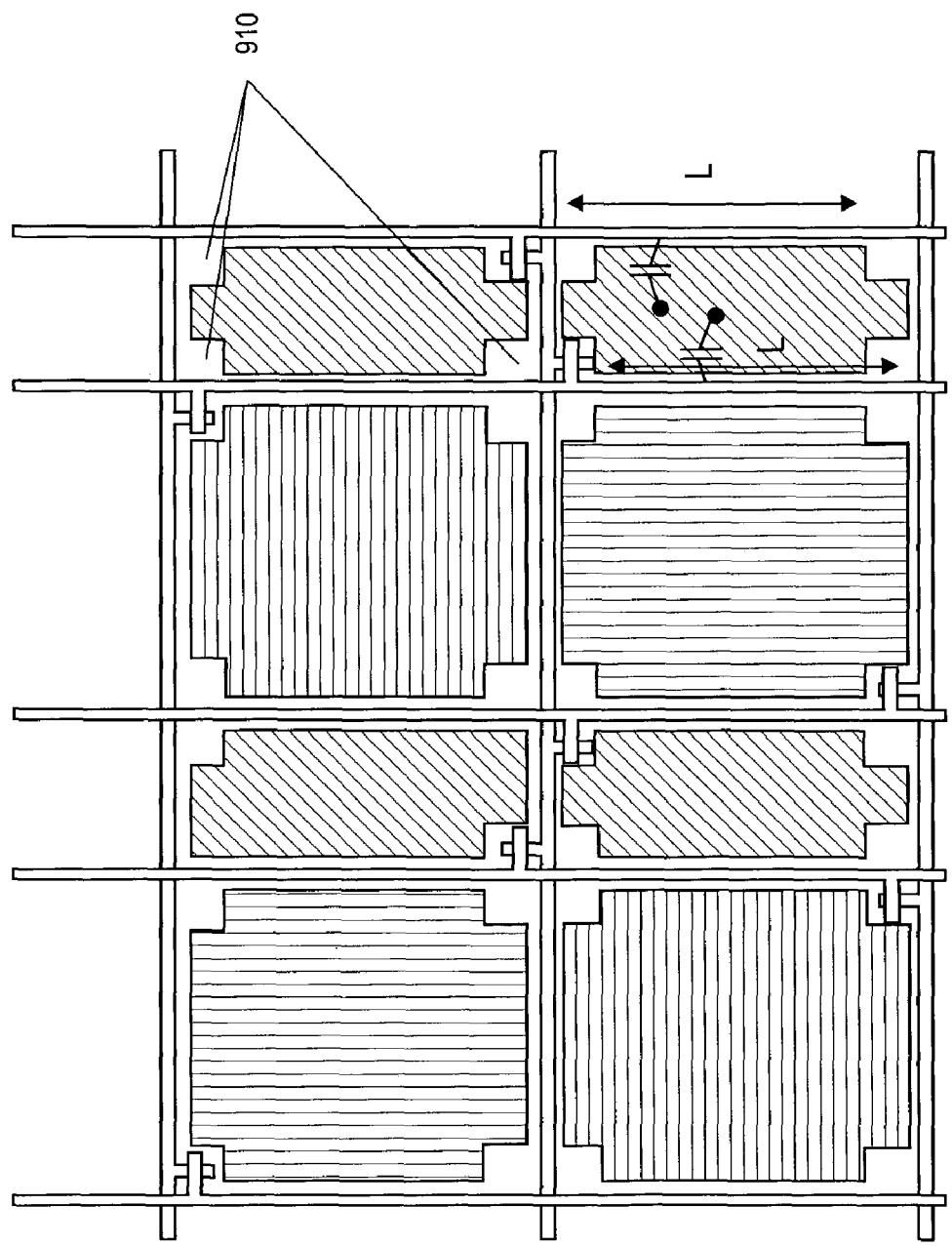
FIG. 9 shows yet another novel pixel element design having multiple corners

FIGS. 8 and 9 are embodiments of pixel elements with corners 810 and 910 removed to match the one corner removed containing the TFT structure. These pixel elements as designed here may balance the parasitic capacitances than a normal pixel structure.

Figure 10:
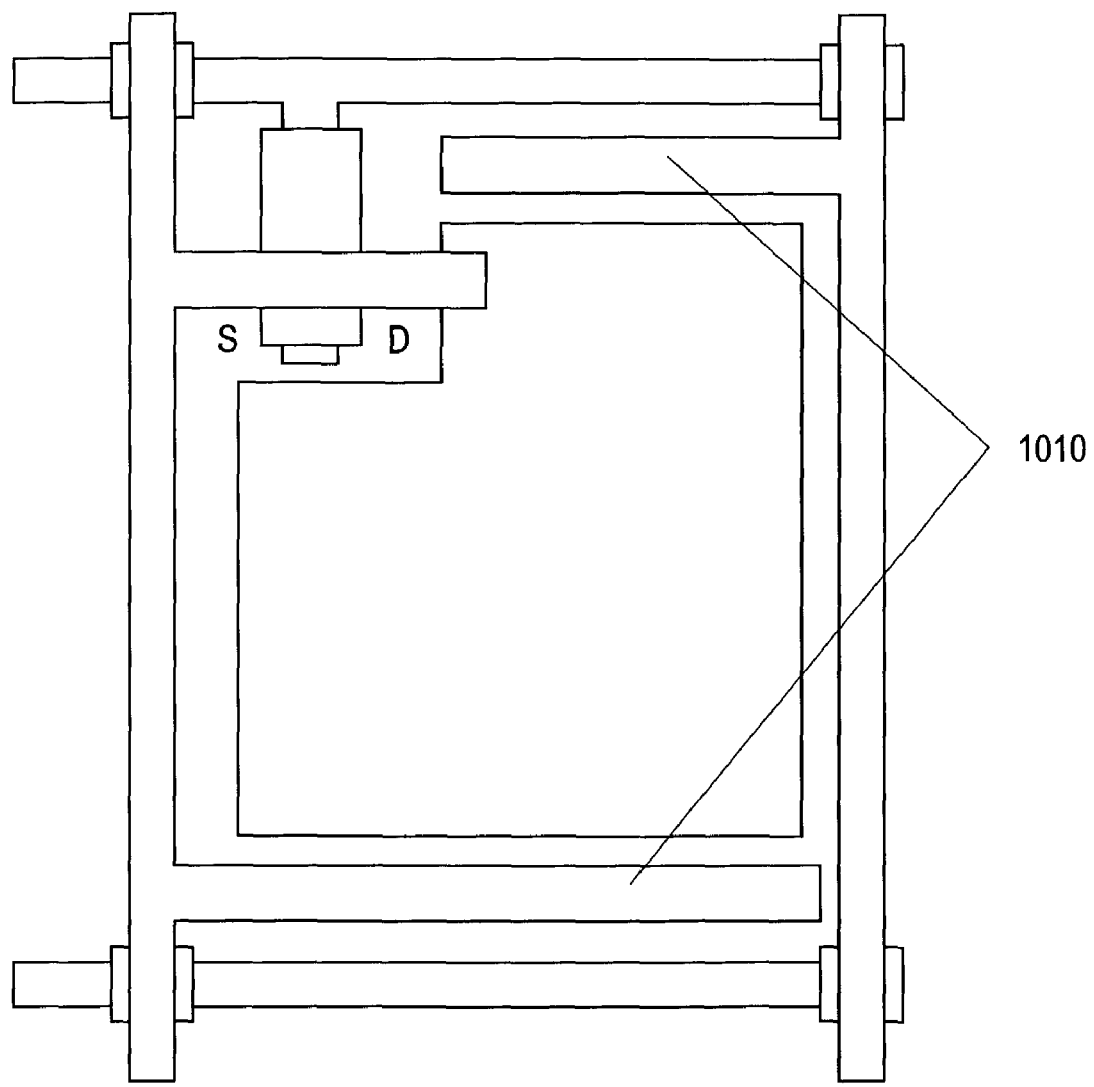
FIG. 10 shows yet another novel pixel structure in which at least one extra line is added to shield the pixel element from parasitic effects.

FIG. 10 is another embodiment of a pixel structure that employs at least one extra metal line 1010 that may help to shield the pixel element from the parasitic capacitances between the gate lines and the pixel element. Additionally, if a dot inversion scheme is employed, then the opposing polarities on both lines 1010 will also help to balance any parasitic capacitance between the source lines and the pixel elements.

Regarding the alternative TFT structures and pixel elements disclosed herein, standard LCD fabrication techniques can be implemented to form such structures. Moreover, the column, gate, and electrode lines can be formed of transparent material such as transparent conductive oxide so as not to degrade the optical qualities of the LCD.

What is claimed is:

1. A device comprising a plurality of first thin film transistors and a plurality of second thin film transistors, each of said first and said second thin film transistors comprising a source electrode, a gate electrode, and a drain electrode;
    wherein at least one of said first thin film transistors comprises the source electrode, the gate electrode and the drain electrode being sequentially arranged along a normal orientation away from its corresponding data line,
    at least one of said second thin film transistors comprises the drain electrode, the gate electrode and the source electrode being sequentially arranged along a reverse orientation away from its corresponding data line; and
    wherein, in the second thin film transistor, (i) a crossover is formed by the data line corresponding to the second thin film transistor and the gate electrode of the second thin film transistor when the data line is connected to the source electrode of the second thin film transistor; or (ii) a first crossover is formed by the data line corresponding to the second thin film transistor and the gate line connected to the second thin film transistor when the data line is connected to the source electrode of the second thin film transistor, the first crossover being spaced apart from a second crossover where the gate line connected to the second thin film transistor crosses the data line corresponding to the second thin film transistor;
    wherein said crossover in (i) or said first crossover in (ii) serve to effect substantially the same source electrode and drain electrode orientation as in said first thin film transistor;
    wherein said first thin film transistors comprise a crossover to substantially balance any parasitic capacitance affected by said crossover in said second thin film transistor.

2. The device of claim 1 wherein any misalignment of thin film transistors are substantially the same for said first thin film transistors and said second thin film transistors.

3. The device of claim 1 wherein said device further comprises a plurality of pixel elements, each said pixel element connected to a thin film transistor wherein said thin film transistor comprises one of a group of thin film transistors, said group comprising said first thin film transistor and said second thin film transistor;
    wherein further said pixel elements have a first corner and a second corner removed wherein further said second corner is placed where said thin film transistor connects with said pixel element.

4. The device of claim 1 wherein said data line corresponding to the first thin film transistor coincides with the data line corresponding to the second thin film transistor.

5. The device of claim 1 where the gate line connected to the second thin film transistor is also connected to the first thin film transistor.

6. A device comprising a plurality of first thin film transistors and a plurality of second thin film transistors, each of said first and said second thin film transistors comprising a source electrode, a gate electrode, and a drain electrode;
    wherein at least one of said first thin film transistors comprises the source electrode, the gate electrode and the drain electrode being sequentially arranged along a normal orientation away from its corresponding data line,
    at least one of said second thin film transistors comprises the drain electrode, the gate electrode and the source electrode being sequentially arranged along a reverse orientation away from its corresponding data line; and
    wherein, in the second thin film transistor, (i) a crossover is formed by the data line corresponding to the second thin film transistor and the gate electrode of the second thin film transistor when the data line is connected to the source electrode of the second thin film transistor; or (ii) a first crossover is formed by the data line corresponding to the second thin film transistor and the gate line connected to the second thin film transistor when the data line is connected to the source electrode of the second thin film transistor, the first crossover being spaced apart from a second crossover where the gate line connected to the second thin film transistor crosses the data line corresponding to the second thin film transistor;
    wherein said device further comprises a plurality of pixel elements, each said pixel element connected to a thin film transistor wherein said thin film transistor comprises one of a group of thin film transistors, said group comprising said first thin film transistor and said second thin film transistor;
    wherein further said pixel elements have a first corner and a second corner removed wherein further said second corner is placed where said thin film transistor connects with said pixel element;
    wherein said pixel element comprises a boundary contour and said boundary contour further comprises a first portion of said boundary contour where said first corner being removed comprises a shape substantially the shape of a second portion of said boundary contour comprising said second corner comprising said thin film transistor.

7. The device of claim 6 wherein said crossover in (i) or said first crossover in (ii) serve to effect substantially the same source electrode and drain electrode orientation as in said first thin film transistor.

8. A display panel with a first side and a second side opposite to the first side, the display panel comprising:
    a plurality of source lines;
    a plurality of gate lines;
    a plurality of pixel elements;
    a plurality of thin film transistors (TFTs) each of which connects a respective pixel elements to a respective source line, each TFT comprising: a gate electrode connected to a respective gate line; a source electrode connected to the respective source line; and a drain electrode connected to the respective pixel element;
    wherein in top view, each gate electrode of each TFT connecting any one of said pixel elements to any one of said source lines comprises a portion positioned between the TFT's source and drain electrodes, said portion comprising a first edge facing the drain electrode and the second edge facing the source electrode, wherein the first edge is on the first side of the second edge;

wherein at least one said gate electrode is on the first side of the respective source line, and at least one other said gate electrode is on the second side of the respective source line.

9. The display panel of claim 8 wherein at least one said TFT is on the first side of the respective source line, and at least one other said TFT is on the second side of the respective source line.

10. The display panel of claim 8 wherein in each TFT located on the second side of the respective source line, the source electrode crosses the gate electrode or the gate line.

11. The display panel of claim 9 wherein each TFT located on the first side of the respective source comprises a member extending from the respective source line and crossing the gate electrode to increase the parasitic capacitance between the respective source line and the gate electrode to improve the match between the parasitic capacitance of the TFTs located on the first side of the respective source lines and the TFTs located on the second side of the respective source lines.

12. The display panel of claim 8 wherein each pixel element comprises a first corner region on the first side of the pixel element and a second corner region on the second side of the pixel element;

wherein each TFT located on the first side of the respective source line is at least partially located in a cutout formed in the second corner region of the respective pixel element, and the respective pixel element also comprises a cutout in the second corner region, the cutout containing no part of any TFT connecting any one of said pixel elements to any one of said source lines;

wherein each TFT located on the second side of the respective source line is at least partially located in a cutout formed in the first corner region of the respective pixel element, and the respective pixel element also comprises a cutout in the first corner region, the cutout containing no part of any TFT connecting any one of said pixel elements to any one of said source lines.

13. A display panel with a first side and a second side opposite to the first side, the display panel comprising:
a plurality of source lines;
a plurality of gate lines;
a plurality of pixel elements;
a plurality of thin film transistors (TFTs) each of which connects a respective pixel elements to a respective source line, each TFT comprising: a gate electrode connected to a respective gate line; a source electrode connected to the respective source line; and a drain electrode connected to the respective pixel element;

wherein in top view, each drain electrode of each TFT connecting any one of said pixel elements to any one of said source lines is connected to the respective pixel element on the first side of the gate electrode;

wherein at least one said gate electrode is on the first side of the respective source line, and at least one other said gate electrode is on the second side of the respective source line.

14. The display panel of claim 13 wherein each drain electrode of each TFT connecting any one of said pixel elements to any one of said source lines is located on the first side of the gate electrode.

15. The display panel of claim 13 wherein at least one said TFT is on the first side of the respective source line, and at least one other said TFT is on the second side of the respective source line.

16. The display panel of claim 13 wherein in each TFT located on the second side of the respective source line, the source electrode crosses the gate electrode or the gate line.

17. The display panel of claim 16 wherein each TFT located on the first side of the respective source comprises a member extending from the respective source line and crossing the gate electrode to increase the parasitic capacitance between the respective source line and the gate electrode to improve the match between the parasitic capacitance of the TFTs located on the first side of the respective source lines and the TFTs located on the second side of the respective source lines.

18. The display panel of claim 13 wherein each pixel element comprises a first corner region on the first side of the pixel element and a second corner region on the second side of the pixel element;

wherein each TFT located on the first side of the respective source line is at least partially located in a cutout formed in the second corner region of the respective pixel element, and the respective pixel element also comprises a cutout in the second corner region, the cutout containing no part of any TFT connecting any one of said pixel elements to any one of said source lines;

wherein each TFT located on the second side of the respective source line is at least partially located in a cutout formed in the first corner region of the respective pixel element, and the respective pixel element also comprises a cutout in the first corner region, the cutout containing no part of any TFT connecting any one of said pixel elements to any one of said source lines.

* * * * *